United States Patent [19]

Chin et al.

[11] Patent Number: 4,617,192

[45] Date of Patent: Oct. 14, 1986

[54] PROCESS FOR MAKING OPTICAL INP DEVICES

[75] Inventors: Aland K. Chin, Berkeley Heights; Shobha Singh, Summit; LeGrand G. V. Uitert, Morris Township, Morris County; George J. Zydzik, Columbia, all of N.J.

[73] Assignee: AT&T Bell Laboratories, Murray Hill, N.J.

[21] Appl. No.: 707,173

[22] Filed: Feb. 28, 1985

Related U.S. Application Data

[63] Continuation of Ser. No. 451,789, Dec. 21, 1982, abandoned.

[51] Int. Cl.[4] .......................... B05D 3/06; B05D 5/06
[52] U.S. Cl. .......................................... 427/42; 427/74; 427/82; 427/87; 427/91; 427/162; 427/163; 427/166; 427/248.1; 427/255; 427/255.3; 427/294
[58] Field of Search ................. 427/42, 166, 162, 163, 427/255.3, 255, 248.1, 294, 87, 91, 82, 74

[56] References Cited

U.S. PATENT DOCUMENTS 3,756,193  9/1973  Carmichael et al. ................. 427/42
3,756,847  9/1973  Leibowitz et al. .................... 427/42
4,160,185  7/1979  Tomasetti et al. .................... 427/42

OTHER PUBLICATIONS

*Electronic Letters* 11, No. 8, "Zero Material Dispersion in Optical Fibers", pp. 176–178, Apr. 1975.
*Laser Focus*, "Photodiodes for Long-Wavelength Communication Systems", Dec. 1982, pp. 81–90.
Physical Vapor Deposition, by Airco Temescal (A division of Airco, Inc.) 1976.

*Primary Examiner*—Norman Morgenstern
*Assistant Examiner*—Janyce A. Bell
*Attorney, Agent, or Firm*—Walter G. Nilsen

[57] ABSTRACT

The invention is a process for putting down coatings of aluminum oxide on optical surfaces using electron-beam deposition in an oxygen-enriched atmosphere. Particularly good results are obtained when oxygen is flowed over or directed at the surface to be coated. Such coatings have extremely low losses compared to many conventional optical coatings and are particularly useful for anti-reflection coatings on various devices. In particular, for optical devices with indium phosphide surfaces operating at wavelengths near 1.3 $\mu$m, the optical properties of aluminum oxide coatings are near optimum for anti-reflection coatings and the thermal expansion characteristics are a close match to those of indium phosphide.

22 Claims, 2 Drawing Figures

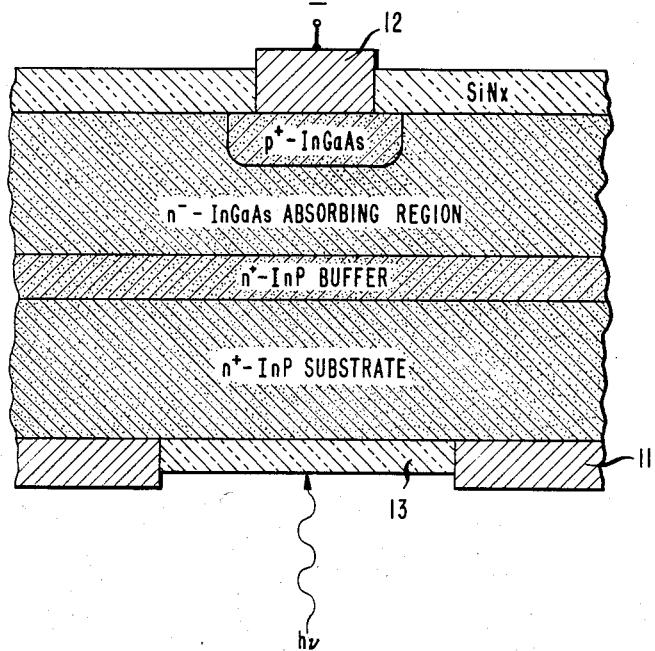
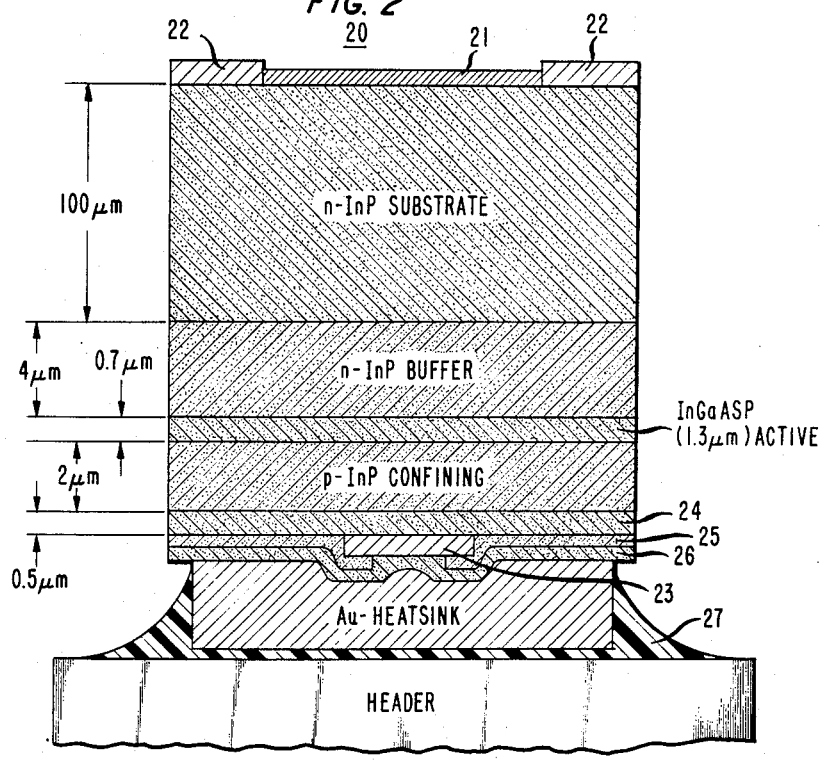

PROCESS FOR MAKING OPTICAL INP DEVICES

This application is a continuation, of application Ser. No. 451,789, filed Dec. 21, 1982, now abandoned.

TECHNICAL FIELD

The invention is a process for making certain types of optical devices. In particular, the invention involves a process for putting down aluminum oxide coatings on such optical devices.

BACKGROUND OF THE INVENTION

There has been a great increase in recent years in the amount of research and development carried out in optical devices mostly because of the development of optical communication systems and various laser-related systems such as cutting and trimming systems and laser recording systems. The advantages of optical communication systems are well known and include high bandwidth, high rate of information transmission, relative ease of optical multiplexing (transmitting several optical wavelengths on the same optical fiber), and use of glass fibers instead of copper transmission cables. Optical communication systems promise to provide high capacity communication at a much lower cost than traditional copper-based systems.

An optical transmission system is generally made up of an optical source (a light-emitting diode or laser), optical fibers, and a detector. Optical fibers are generally made out of silica glass with various kinds of index of refraction profiles used to insure proper propagation of light down the fiber. Generally, information is transmitted in optical fibers in the form of pulses (so-called pulse code modulation). The bandwidth and repeater spacings of an optical communication system depend not only on losses in the optical fiber but also on the material dispersion of the fiber.

Optical losses in the transmission system may be minimized by judicial use of anti-reflection coatings on surfaces that interface device material and air. In particular, anti-reflection coatings on light-emitting diodes (LED) used in optical communication systems insures greater output of radiation from the LED and into the optical fiber used in the transmission system. Also, the effectiveness of detectors are greatly increased by judicial use of anti-reflection coatings to minimize losses.

Although anti-reflection coatings can be used on a variety of optical devices used in various spectral regions, they are particularly useful for devices used in optical communications in the wavelength region from about 1.2 to 1.6 $\mu$m. There are a number of advantages to the use of light wavelengths in this region. First of all, with many types of fibers, particularly fibers containing silica glass or phosphosilicate glass, losses are minimal in this wavelength region and material dispersion is very low in this region (see, for example, "Zero Material Dispersion in Optical Fibers", by D. N. Payne and W. A. Gambling, *Electronic Letters* 11 No. 8, page 176–178 (April, 1975) and "Photodiodes for Use in Long-Wavelength Fiber-Optic Communication Systems", by S. R. Forrest to appear in the November 1982 issue of *Laser Focus*).

Because of the low loss and low material dispersion, optical communication systems operating in the 1.2 to 1.6 $\mu$m wavelength region (henceforth referred to as the 1.3 $\mu$m region) have the advantage of greater bandwidth and greater repeater spacings. For these reasons, device development (particularly LED and detector development) has been concentrated on this wavelength region. Most such devices use indium phoshide as a substrate material because it is transparent in this wavelength region and the crystal structure provides an excellent lattice match to various compound semiconductors such as indium gallium arsenide and indium gallium arsenide phosphide. For front-emitting diodes and photodiodes, light usually enters or leaves the device through the indium phosphide substrate. For lasers or edge-emitting diodes, light leaves the device through the indium gallium arsenide phosphide active layer. Particularly useful is an anti-reflection coating which would minimize reflection, have extremely low losses, have a thermal expansion coefficient close to that of indium phosphide or indium gallium arsenide phosphide and be applied at reasonable temperatures so as to avoid excessive thermal expansion mismatch. The commercially important indium gallium arsenide phosphide compounds are those that are lattice matched to indium phosphide. Such compounds do not necessarily include all four elements (e.g., indium gallium arsenide).

SUMMARY OF THE INVENTION

The invention is a process for making an optical device in which a coating (generally an anti-reflection coating) is made by electron-beam (E-beam) deposition of $Al_2O_3$ in the presence of excess oxygen preferably at a temperature less than about 250 degrees C. and a pressure less than $10^{-3}$ Torr. Particularly important in the procedure is to have a higher concentration of oxygen near the surface being coated than in the remainder of the vacuum chamber, particularly near the source of the $Al_2O_3$ and the electron beam. Generally, the concentration of oxygen near the surface being coated (within about 2 cm of the surface being coated) is at least a factor of 10 (or even 100) greater than in the rest of the vacuum chamber, and more particularly where the electron beam is and where the electron beam hits the $Al_2O_3$. It is preferred that this be accomplished by admitting essentially pure oxygen to the vacuum chamber close to the sample, preferably by flowing essentially pure oxygen toward the surface being coated. It is preferred that the sample be at a temperature between 50 and 250 degrees C. during coating, more preferably between 50 and 160 degrees C. The procedure is advantageously used on devices with indium phosphide surfaces because of the excellent thermal expansion match between $Al_2O_3$ and InP and the excellent optical transmission results obtained. Particularly important is the presence of oxygen preferably flowed directly on the surface being coated in the electron-beam deposition process because it greatly improves the optical quality and loss characteristics of the anti-reflection coating. Typical optical devices for which such anti-reflection coatings are useful include light-emitting diodes, optical detectors, and lasers. For front-emitting and edge-emitting InP/InGaAsP light-emitting diodes, the use of anti-reflection coatings made in accordance with the invention increased the power coupled into an optical fiber by a factor of 1.3 for front-emitting diodes and 1.4 for edge emitting diodes.

BRIEF DESCRIPTION OF THE DRAWINGS

FIG. 1 shows a side view of a planar PIN photodiode with anti-reflection coating made in accordance with the invention; and FIG. 2 shows a light emtting diode with anti-reflection coating made in accordance with the invention.

DETAILED DESCRIPTION

The invention is based on the discovery that excellent optical coatings (particularly anti-reflection coatings) can be made using $Al_2O_3$ as the dielectric provided the $Al_2O_3$ is put down by electron-beam (E-beam) deposition while a small amount of oxygen is admitted into the vacuum chamber of the electron-beam deposition chamber. An important feature of the invention is that the oxygen concentration (partial pressure) near the surface being coated with $Al_2O_3$ (say within 2 cm) be greater (by a factor of at least 10, preferably 100) than the oxygen concentration (partial pressure) away from the surface and near the source of the electron beam. Best results are obtained by flowing an oxygen-enriched gas close to the sample being coated, usually directed onto the surface being coated. Although the details of the procedure to deposit the $Al_2O_3$ by E-beam deposition may vary somewhat, it is important that the oxygen content of the gas in the vacuum chamber be at least 30 volume percent. It is preferred that the oxygen-enriched gas be directed toward the sample being coated with a flow rate of at least 0.01 milliters per minute (volume based on a pressure of one atmosphere) when the pumping rate is sufficient to keep the vacuum chamber pressure less than $10^{-5}$ Torr. A typical maximum leak rate is 10 ml/minute. A preferred rate is from 0.03 to 3.0 ml/minute, with the range from 0.1 to 1.0 ml/minute most preferred. This procedure results in a high oxygen concentration in the vicinity of the sample. This is particularly true if highly-enriched gas (60 volume percent, 90 volume percent or most preferably essentially pure oxygen) is admitted close to the sample preferably directed toward the surface to be coated. This procedure results in $Al_2O_3$ films with extremely low losses as well as other desirable properties associated with the use of $Al_2O_3$. Higher oxygen content in the gas flow is preferred, say 60 or even 90 volume percent increases the possibility of even lower losses in the $Al_2O_3$ coating. Naturally, essentially pure oxygen is most preferred being convenient since pure oxygen can be admitted into the system and pure oxygen yields extremely low losses.

The coatings of $Al_2O_3$ can be used for a large variety of purposes including anti-reflection coatings (both single layer and multilayer), protective coatings, dielectric mirrors, etc. Such coatings are useful over a very wide range of wavelengths, typically from the ultraviolet wavelengths where $Al_2O_3$ absorbs (0.2 $\mu$m) to the infrared wavelengths where $Al_2O_3$ absorbs (3.0 $\mu$m). Most useful is the visible and near infrared wavelengths (0.5 to 2.0 $\mu$m) where $Al_2O_3$ has usually good optical and mechanical properties. The range from 0.8 to 1.5 $\mu$m is extremely useful because of the large number of devices used in this wavelength range.

An understanding of the invention is facilitated by a description of electron-beam technology as a procedure for depositing $Al_2O_3$ on a surface. This technology is discussed in a number of references including "Physical Vapor Deposition" published by Airco Temescal (A division of Airco, Inc.) 2850 Seventh Street, Berkeley, Calif. 94710.

In this procedure, an electron beam is used to evaporate a material for condensation on a surface. The procedure is highly advantageous for a number of reasons. Improved electron guns permit high evaporation rates. It is relatively easy to keep the evaporated material free of contamination. The process can be precisely controlled and there is an excellent economy of material and a high thermal efficiency.

Generally, the electron-beam evaporation process is carried out in a vacuum environment. Typically, the chamber pressure is less than about $10^{-4}$ Torr. Typical chamber pressures are in the range from $10^{-5}$ to $10^{-6}$ Torr. The invention involves use of high oxygen concentrations in the vicinity of the sample being coated. The particular advantage of the flow procedure is that the concentration (partial pressure) of oxygen near the sample is kept high but the pressure in the rest of the chamber is kept low. Basically, it is required that the oxygen content of this gas should be greater than that found in air; that is, the residual gas be an oxygen enriched gas. Generally, this means that the oxygen content of the gas is greater than 30 weight percent. Best results are obtained with high oxygen content and this is usually easy to obtain. Typically, oxygen is piped from a regulator value to a position close to the sample and directed onto the sample while the vacuum chamber is being evacuated at the opposite end of the chamber by conventional means. This procedure insures a relatively high concentration of oxygen in the vicinity of the sample compared to the rest of the chamber. The flow rate is ordinarily between 0.01 and 10.0 milliliters per minute with preferred values of 0.03 to 3.0 milliliters per minute.

Another indication of flow rate being admitted to the vacuum chamber is as follows: under ordinary conditions, the vacuum chamber pumps down to a chamber vacuum of $2 \times 10^{-6}$ Torr. The flow rate of the gas being admitted to the vicinity of the sample should be such that it increases the chamber vacuum to between $5 \times 10^{-6}$ and $5 \times 10^{-5}$ Torr.

Another way of setting forth the limits on oxygen content of the residual gas is in terms of partial pressure. Considering that the residual gas is at least 30 weight percent oxygen, the partial pressure of oxygen in the vacuum chamber as ordinarily measured should be between $10^{-4}$ and $10^{-6}$ Torr, while that near the sample may well be an order of magnitude or more greater (perhaps in the range from $10^{-2}$ to $10^{-5}$ Torr). Preferred is an oxygen content for the residual gas of at least 95 weight percent, with the partial pressure of oxygen between $10^{-4}$ and $10^{-6}$ Torr as ordinarily measured. Preferentially, the chamber pressure should be between $10^{-5}$ and $10^{-6}$ Torr.

The admission of a directed flow of oxygen (preferably essentially pure oxygen) into the chamber close to the surface being coated with $Al_2O_3$ is a preferred practice of the invention. This procedure increases the partial pressure of oxygen near the sample to a value greater than that obtained in the absence of directed flow and much greater than the pressure in the vacuum chamber, without interfering with the evaporation of the $Al_2O_3$ by the electron beam at a low pressure ($10^{-5}$–$10^{-6}$ Torr) and while providing a buffer against the impact of electrons reflected from the surface of the melt of $Al_2O_3$.

The process for depositing the $Al_2O_3$ is useful for a variety of devices but is particularly useful for optical devices such as lasers, optical detectors, and light-emitting diodes. Although useful for a variety of purposes, its exceptionally low loss is most useful for surfaces that are involved in the transmission of radiation (generally infrared, visible, or ultraviolet radiation but including other radiation where useful). Typical application is to anti-reflection coating for optical surfaces.

The most useful application of this process involves optical devices in the wavelength range from 1.2 to 1.6 μm. This is a particularly important wavelength range for optical communications because of low optical loss and low dispersion in conventional optical fibers. The compound semiconductors, indium phosphide and indium gallium arsenide phosphide, are used extensively in this wavelength range and are usually the substances through which radiation passes in going into air. Thus, anti-reflection coatings on devices used in the 1.2 to 1.6 μm range are usually needed on indium phosphide and indium gallium arsenide phosphide surfaces.

Aluminum oxide is ideal for this application for a variety of reasons. First, the coefficient of thermal expansion of $Al_2O_3$ ($\sim 5.6 \times 10^{-6}$/deg K) is very close to that of indium phosphide ($\sim 4.5 \times 10^{-6}$/deg K). A close match in thermal expansion minimizes the chances of cracking and peeling of the $Al_2O_3$ film. Such films can be put down at relatively modest temperatures which minimize stress from the small thermal expansion mismatch and minimize exposure of the optical device to thermal effects. The sample should be heated to at least 50 degrees C. to ensure good film deposition and less than 250 degrees C. to minimize damage to the device. The upper temperature tends to vary with use and mounting. In general, however, a preferred working range is to initially heat the sample to 60 degrees C. and allow it to rise in temperature to about 160 degrees C. due to incident radiation from the source during deposition of $Al_2O_3$.

In addition, $Al_2O_3$ is practically ideal for use as an anti-reflection coating on indium phosphide with air as one of the optical mediums. For a single layer anti-reflection coating, optimum results can be obtained if the index of refraction of the anti-reflection coating is the square root of the index of refraction for the indium phosphide. (See Born and Wolf, *Principals of Optics*, MacMillan and Co., 1964, pp. 64.).

At a wavelength of 1.3 μm, the index of refraction for indium phosphide is 3.21 so that the optimum value for the index of refraction of a single layer anti-reflection material is 1.79. The index of refraction of $Al_2O_3$ is 1.77, almost exactly that required for the above application. For the above reasons, $Al_2O_3$ is extremely useful as an anti-reflection coating material on optical devices in the wavelength range from 1.2 to 1.6 μm. Typical devices are lasers, light-emitting diodes, and optical detectors. The invention can be particularly well illustrated by a description of a device in which the process can be used. This device is shown in FIG. 1. It is a photodetector useful in the wavelength range from 1.2 to 1.6 μm. The particular details of the photodetector are given in FIG. 1. For completeness, we remark that the back contact 11 is generally made of a conducting metal such as gold and the top contact 12 is also generally metallic and typically made of gold. Light to be detected by the photodetector enters the device as shown across a surface 13 which is made in accordance with the invention. The aluminum oxide is of such thickness so as to minimize reflections from this surface.

FIG. 2 shows another type of device in which films of $Al_2O_3$ made in accordance with the invention is extremely useful. This device is a light-emitting diode which emits radiation in the wavelength range from 1.2 to 1.6 μm and is equipped with an anti-reflection coating 21 made in accordance with the invention. Also shown is various metal contacts 22 generally made of gold and a p-contact 23 also made of gold. Also shown are various layers of compound semiconductors such as p-InGaAsP 24, a titanium layer 25, and a gold layer 26. Particularly important in the structure of the device is an epoxy layer 27 which attaches the device to a header to dissipate heat. Often the presence of epoxy limits the temperature to which the device can be exposed in fabrication procedures.

Experiments were carried out in accordance with the invention in which anti-reflection coatings were put on devices as described in FIGS. 1 and 2 in order to minimize reflections. Typically, the thickness of the layers was 1850 Angstrom units which was arrived at so as to produce a maximum transmission at a wavelength of 1.3 μm. The source in the electron beam device was extremely pure single crystal $Al_2O_3$. The vacuum chamber was pumped out, and after arriving at a background pressure of about $2.0 \times 10^{-6}$ Torr, oxygen was bled into the vacuum chamber to a pressure of approximately $7.5 \times 10^{-6}$ Torr. The oxygen was bled into the vacuum chamber in the vicinity of the surface of the sample being coated with $Al_2O_3$. The devices being coated were individually heated to a surface temperature of about 60 degrees C. using a radiant heater before starting deposition. This was done to insure good film adherence. During the coating process, the surface temperature often reached as high as 160 degrees C. because of heat radiation from the $Al_2O_3$ source. This modest heating of the surface being coated insures a useful, highly adherent coating.

In order to demonstrate the usefulness of good anti-reflection coatings on optical devices, a series of experiments was carried out which determined the increase in transmission and device performance achieved using such coatings. Three sets of light-emitting diodes were evaluated before and after putting down an anti-reflection coating made in accordance with the invention. Device efficiency was measured by determining amount of power coupled into an optical fiber. It was found that the anti-reflection coating resulted in an increase of power coupled into the optical fiber of a factor of approximately 1.31±0.08. This result demonstrates the extremely high improvement in transmission by using such anti-reflection coatings. In addition, it was found that the results were highly reproducible and uniform from sample to sample. This improvement compared favorably with other types of anti-reflection coatings. When oxygen was not added in accordance with the invention, no improvement was found.

In a second test, edge-emitting diodes were coated with an 1850 Angstrom thick layer of $Al_2O_3$ over the emitting edges using the foregoing conditions and oxygen flow. An improvement of greater than 40 percent in emitted light was obtained. Again, this improvement in performance is much greater than obtained by conventional procedures.

What is claimed is:

1. A process for making an optical device comprising at least one semiconductor substrate with optical surface for the transmission of radiation, said optical surface at least partially coated with a coating consisting essentially of aluminum oxide put down by electron-beam deposition in a vacuum chamber, said vacuum chamber comprising semiconductor substrate with optical surface and source, characterized in that the electron-beam deposition is carried out with a pressure in the vacuum chamber of less than $10^{-3}$ Torr, the oxygen content of the gas in the vacuum chamber is greater than 30 percent by volume, and the concentration of oxygen near the semiconductor substrate with optical surface is at least a factor of 10 greater than near the electron-beam source and the source comprises single crystal aluminum oxide.

2. The process of claim 1 in which the oxygen content of the gas in the vacuum chamber is greater than 60 percent by volume.

3. The process of claim 2 in which the oxygen content of the gas in the vacuum chamber is greater than 90 percent by volume.

4. The process of claim 3 in which the gas in the vacuum chamber consists essentially of oxygen.

5. The process of claim 1 in which the pressure in the vacuum chamber is less than $10^{-4}$ Torr.

6. The process of claim 8 in which the pressure is less than $10^{-5}$ Torr.

7. The process of claim 1 in which a gas consisting of at least 30 percent oxygen in admitted into the vacuum chamber near the surface being coated, and the flow of gas is directed toward the surface being coated.

8. The process of claim 7 in which the gas consists essentially of oxygen.

9. The process of claim 8 in which the gas is admitted into the vacuum chamber at a rate from 0.01 to 10 milliliters per minute.

10. The process of claim 9 in which the rate is from 0.03 to 3.0 milliliters per minute.

11. The process of claim 1 in which the optical surface is at a temperature between 50 and 250 degrees C.

12. The process of claim 11 in which the temperature range is from 50 to 160 degrees C.

13. The process of claim 1 in which the optical device is a light-emitting diode.

14. The process of claim 1 in which the optical device is an optical detector.

15. The process of claim 1 in which the optical device is a laser.

16. The process of claim 1 in which the radiation is in the wavelength range from 0.5 to 2.0 μm.

17. The process of claim 16 in which the wavelength range is from 0.8 to 1.6 μm.

18. The process of claim 17 in which the wavelength range is from 1.2 to 1.6 μm.

19. The process of claim 1 in which the optical surface consists essentially of indium phosphide.

20. The process of claim 19 in which the optical device is a photodetector.

21. The process of claim 19 in which the optical device is a light-emitting diode.

22. The process of claim 1 in which the coating is an anti-reflection coating.

* * * * *

UNITED STATES PATENT AND TRADEMARK OFFICE
CERTIFICATE OF CORRECTION

PATENT NO. : 4,617,192

DATED : October 14, 1986

INVENTOR(S) : Aland K. Chin, Shobha Singh, LeGrand G. Van Uitert and George J. Zydzik It is certified that error appears in the above-identified patent and that said Letters Patent is hereby corrected as shown below:

In the Title Page, Item (75) ,"LeGrand G. V. Uitert" should read --LeGrand G. Van Uitert--. Column 7, line 17, "8" should read --5--.

Signed and Sealed this

Thirty-first Day of March, 1987

Attest:

DONALD J. QUIGG

Attesting Officer

Commissioner of Patents and Trademarks